US005712490A

United States Patent [19]

Smith

[11] Patent Number: 5,712,490

[45] Date of Patent: Jan. 27, 1998

[54] RAMP CATHODE STRUCTURES FOR VACUUM EMISSION

[75] Inventor: Arlynn W. Smith, Blue Ridge, Va.

[73] Assignee: ITT Industries, Inc., White Plains, N.Y.

[21] Appl. No.: 754,765

[22] Filed: Nov. 21, 1996

[51] Int. Cl.[6] .......... H01L 29/06; H01L 29/12; H01J 31/00

[52] U.S. Cl. .......... 257/11; 257/191; 257/655; 257/10; 313/542; 313/543; 313/346 R; 313/373; 313/374

[58] Field of Search .......... 257/10, 11, 191, 257/655; 313/542, 543, 544, 346 R, 366, 367, 368, 373, 374, 539

[56] References Cited

U.S. PATENT DOCUMENTS

| | | | |
|---|---|---|---|
| 3,631,303 | 12/1971 | Antypas | 257/10 |
| 3,814,993 | 6/1974 | Kennedy | 257/10 |
| 3,959,037 | 5/1976 | Gutierrez et al. | 257/10 |
| 4,853,754 | 8/1989 | Van Gorkom et al. | 257/11 |
| 4,961,025 | 10/1990 | Thomas et al. | 313/524 |
| 4,999,211 | 3/1991 | Duggan | 427/8 |
| 5,047,821 | 9/1991 | Costello et al. | 257/11 |
| 5,114,373 | 5/1992 | Peckman | 445/3 |
| 5,298,831 | 3/1994 | Smith | 313/373 |
| 5,314,363 | 5/1994 | Murray | 445/14 |
| 5,360,630 | 11/1994 | Thomas et al. | 427/64 |
| 5,402,034 | 3/1995 | Blouch et al. | 313/370 |
| 5,404,026 | 4/1995 | Mariella, Jr. et al. | 257/11 |
| 5,463,275 | 10/1995 | Chen et al. | 257/10 |

OTHER PUBLICATIONS

A.J. Kennedy, "Tunable Field Assisted Double Heterojunction Infrared Photocathodes," 1973 Conference on Electron Device Technique, May 1973, pp. 51–56.

*Primary Examiner*—Jerome Jackson
*Assistant Examiner*—John Guay
*Attorney, Agent, or Firm*—Plevy & Associates

[57] ABSTRACT

A photocathode device is disclosed including an active layer, a composition ramp layer and an emission layer including an emission surface. The active layer, ramp layer and emission layer each have both a predetermined material composition and a predetermined doping level for maintaining the conduction band of the device flat until the emission surface which functions to increase the photoresponse of the device.

19 Claims, 2 Drawing Sheets

RAMP CATHODE STRUCTURES FOR VACUUM EMISSION

BACKGROUND OF THE INVENTION

1. Field of the Invention

The present invention relates generally to image intensifier tubes, and more particularly to a cathode device that utilizes a composition ramp structure in order to increase the photoresponse of the device.

1. Description of the Prior Art

Image intensifier tubes are utilized to multiply the amount of incident light received in order to provide an increase in light output which is supplied to a camera or directly to the eyes of the viewer. These devices are particularly useful for providing images from dark regions and have been utilized in both industrial and military applications. An example of such a device is described in U.S. Pat. No. 5,314,363 to Murray, entitled AUTOMATED SYSTEM AND METHOD FOR ASSEMBLING IMAGE INTENSIFIER TUBES, issued May 24, 1994.

Image intensifier tubes typically include a photocathode, a microchannel plate and a phosphor screen. The photocathode consists of a photoemissive wafer which is bonded to a glass faceplate. Materials used for photocathodes in modern day image intensifiers are GaAs and other III–V materials. Light enters the faceplate and strikes the wafer which causes a primary emission of electrons. The electrons are accelerated across a gap by an electric field to the microchannel plate. The microchannel plate is utilized to significantly amplify the initial electron stream from the cathode. The phosphor screen which functions as an anode receives the electrons to form a visible image.

Photocathode devices play an important role in image intensifier tubes. Various methods and structures have been developed in order to further enhance the performance of photocathode devices. Examples of these developments are described in U.S. Patent to Thomas et al., entitled CATHODE FOR IMAGE INTENSIFIER TUBE HAVING REDUCED VEILING GLARE, issued Oct. 2, 1990, U.S. Pat. No. 4,999,211 to Duggan, entitled APPARATUS AND METHOD FOR MAKING A PHOTOCATHODE, issued Mar. 12, 1991 and U.S. Pat. No. 5,298,831 to Amith, entitled METHOD OF MAKING PHOTOCATHODES FOR IMAGE INTENSIFIER TUBES, issued Mar. 29, 1994.

Typical photocathodes in state of the art image intensifier tubes often include uniform doping and material composition through the entire active depth. An alternative structure utilizes a heavily doped region in the active region near the window layer which follows a doping profile to a lower doped region near the emission surface. The goal of this high to low doping profile is to increase the emission probability, which is defined as the probability that the photogenerated carriers or electrons are forced to the emission surface.

Once the electrons reach the emission surface, an activating surface of a cesium/cesium oxide is utilized in order to emit these electrons to the vacuum. None of the current photocathode structures utilize a material composition change near the emission surface to enhance the photoresponse of the device.

In order to maintain a large emission probability in a photocathode device, the emission surface must be heavily doped to limit the distance over which the conduction band bending takes place. Conduction band bending over a long distance would lead to carriers losing energy resulting in these carriers not being emitted into the vacuum. In uniformly doped structures, this heavy doping in the active region severely limits the diffusion length of the photogenerated carriers. A limited carrier diffusion length means that less electrons survive to reach the emission surface. Thus, the thickness of the active layer cannot be increased to absorb more photons due to the limited diffusion length of the carriers.

The high to low doping structure also has a limited carrier diffusion length. This is because the low doping portion of this structure has essentially the same level of heavy doping used in the uniform doping structure to maintain the same emission probability. Therefore, even though there is a field forcing the carriers toward the emission surface, not enough of these carriers arrive at the surface to increase the photoresponse of the device due to the heavy doping of the active region.

It is therefore, an object of the present invention to provide a photocathode device which has a large emission probability without utilizing large doping concentrations in the active region of the device.

SUMMARY OF THE INVENTION

A photocathode device is disclosed including an active layer, a composition ramp layer and an emission layer including an emission surface. The active layer, ramp layer and emission layer each have both a predetermined material composition and a predetermined doping level for maintaining a flat conduction band profile throughout the device which functions to increase the photoresponse of the device.

It is further disclosed that the window layer is of a AlGaAs material, the active and emission layers are of a GaAs material and that the ramp layer transitions from a GaAs material to an AlGaAs material.

BRIEF DESCRIPTION OF THE DRAWING

The above objects, further features and advantages of the present invention are described in detail below in conjunction with the drawings, of which.

DETAILED DESCRIPTION OF THE DRAWING

The present invention is directed to a photocathode device that utilizes a composition ramp structure in order to increase the photoresponse of the device. The composition ramp structure according to the present invention includes a composition of materials which maintains the conduction band flat until the emission surface of the device, which provides the device with a higher emission probability. This structure also increases the diffusion length of the photogenerated carriers and thus provides a capability for increasing photon absorption.

Figure 1:
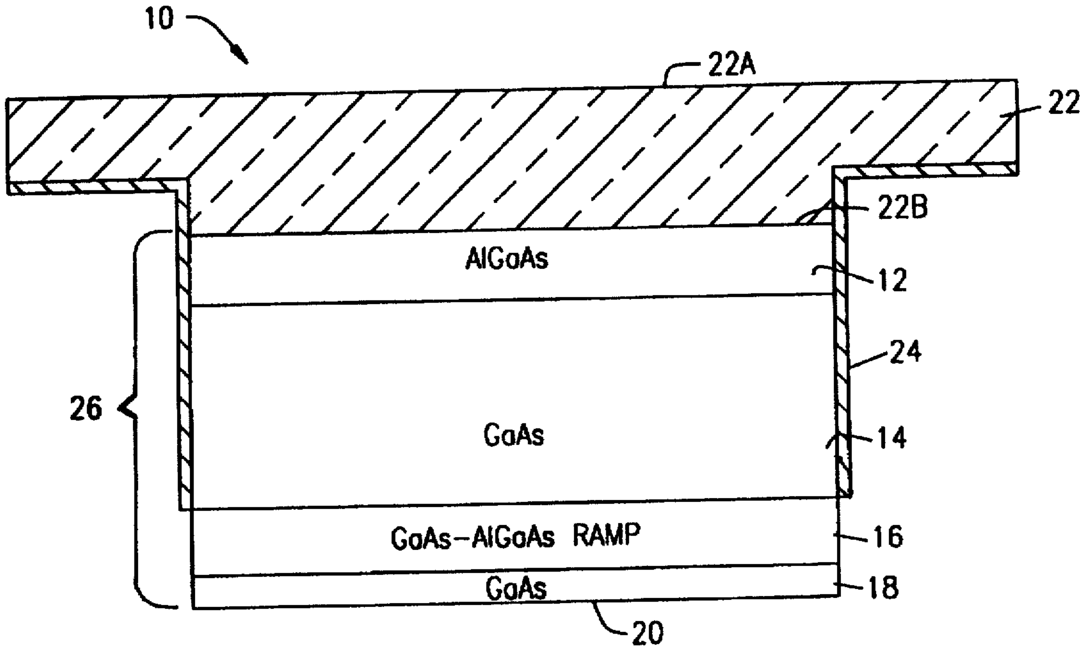
FIG. 1 is a cross sectional view of the photocathode according to the present invention.

Referring to FIG. 1, there is shown a cross sectional view of the photocathode according to the present invention. The cathode 10 includes a photoemissive wafer 26 which is bonded to the faceplate 22. The photoemissive wafer 26 contains the composition ramp structure according to the present invention and will be described in detail later.

The faceplate 22 is preferably made of a clear and high quality optical glass such as Corning 7056. This comprises 70 percent silica ($SiO_2$), 17 percent boric oxide ($B_2O_3$), 8 percent potash ($K_2O$), 3 percent Alumina ($Al_2O_3$), one percent of both soda ($Na_2O$) and lithium oxide ($Li_2O$). It should be noted that other types of glasses may also be utilized.

The photoemissive wafer 26 is thermally bonded to a lower surface of the faceplate 22B enabling light impinging on an upper surface of the faceplate 22A to eventually strike the photoemissive wafer 26. As previously described, light striking the photoemissive wafer 26 causes it to emit carriers or electrons, which are utilized to produce an image when received by the phosphor screen (not shown).

Disposed on the outer surface of both the photoemissive wafer 26 and faceplate 22 is a conductive coating 24. The conductive coating 24 is utilized as a contact for coupling the photoemissive wafer 26 to an external biasing power supply (not shown). The biasing power is necessary in order to remove photogenerated holes, reducing recombination, thus allowing the electrons generated within the cathode to diffuse towards the emission surface 20, where these electrons are eventually emitted into a vacuum as previously described.

The emissive wafer 26 according to the present invention has a composition ramp structure in order to increase the photoresponse of the device. The photoemissive wafer 26 also includes a window layer 12. The window layer 12 is fabricated from an Aluminum Gallium Arsenide (AlGaAs) material of a varying thickness and having an Aluminum (Al) composition tailored to the specific requirements of the device 10.

Disposed over the window layer 12 is an active layer 14. The active layer 14 in the present invention is a lightly doped Gallium Arsenide (GaAs) material preferably having a doping concentration of approximately $1\times10^{17}$ $cm^{-3}$. The use of such a low doping concentration is desirable since it increases the diffusion length of the photogenerated carriers. Increasing the diffusion length enables the thickness of the active layer 14 to be increased which enables more photons to be absorbed and thus provides an increase in the photogenerated carriers. In the present invention the thickness of the active layer 14 varies according to the diffusion length of the material and the specific red response of the device 10.

Disposed over the active layer 14 is a composition ramp layer 16. The ramp layer 16 is configured to include a small composition transition and doping transition where the doping density is the same as the active layer, but decreases as the material composition changes to a wider band gap. The composition transition consists of a transition from a GaAs material to an AlGaAs material as the ramp layer 16 extends away from the active layer 14. The doping transition consists of a transition from a doping concentration of approximately $1\times10^{17}$ $cm^{-3}$ to approximately $1\times10^{16}$ $cm^{-3}$ as the ramp layer 16 extends away from the active layer 14. The ramp layer 16 further has a thickness of approximately 0.25 microns.

Disposed over the ramp layer 16 is an emission layer 18 which has a bottom surface known as an emission surface 20. The emission surface 20 as previously described is the surface in a photocathode where the electrons are emitted into the vacuum. The emission layer 18 consists of a very thin layer of GaAs material which functions as an abrupt transition back to GaAs material. This abrupt change in material 18 is utilized to provide the same amount of band bending near the emission surface 20 as in the heavily doped structure described in the prior art. The emission layer has a thickness of approximately 0.025 microns and has a doping concentration of approximately $1\times10^{18}$ $cm^{-3}$. This doping concentration is significant since it is one order of magnitude lower than utilized in current state of the art photocathodes.

The previously described photoemissive wafer 26, including the ramp layer 16 functions to enhance the photo response of the device. This structure 26 enhances the movement of carriers by utilizing a composition of materials which maintains the conduction band profile flat through the device to the emission surface 20, which provides the device 10 with a higher emission probability. The use of a low doping concentration in the majority of the active layer 14 contributes to keeping the conduction band flat. Also, this level of doping increases the diffusion length of the photogenerated carriers, which enables the thickness of the active layer 14 to be increased leading to the absorption of more photons. The materials utilized in the ramp layer 16 and emission layer 18 provide a compositional and doping transition region in order to provide the same amount of band bending as in a heavily doped structure. Therefore, since the thickness of the active layer 14 is increased and the diffusion length is increased, more carriers arrive at the emission surface 20 having an emission probability comparable to heavier doped structures which leads to an increase in the photoresponse of the device 10.

Figure 2:
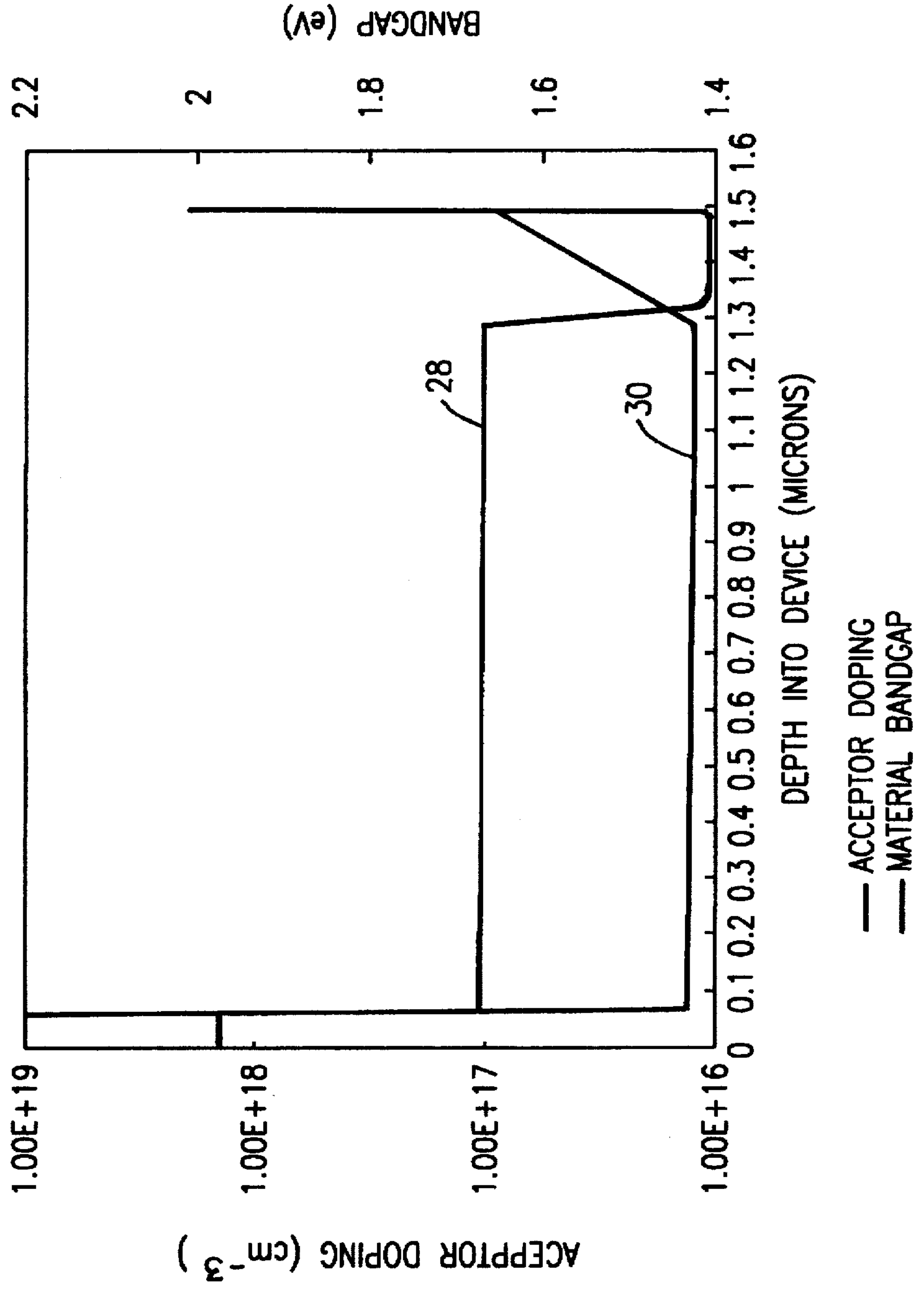
FIG. 2 is a graph illustrating the advantages of the composition ramp structure according to the present invention.

Referring to FIG. 2, a graph illustrating the advantages of the composition ramp structure according to the present invention is shown. The graph includes curves plotting the acceptor doping 28 and material band gap 30 as a function of the depth of the photocathode device according to the present invention. As can be seen in the upper regions of the device (0.1 to 1.3 microns) which corresponds to the active layer the band gap energy is relatively low. This corresponds to the portion of the device that has a relatively flat conduction band, which is due to the material composition and doping level of this layer. In the lower regions of the device (1.3 to 1.5) which corresponds to the ramp and emission layers the band gap energy transitions to a higher level near the emission surface, which is again due to the material composition and doping level of these layers. This enables the emission surface to have a sufficient amount of band bending, which provides an emission probability comparable to heavier doped structures.

The previously described cathode 10 is intended to replace the current photocathodes utilized in image intensifier tubes within the normal process. As in current devices, the photocathode is bonded to a glass face plate. This bonded structure is then positioned in close proximity to the microchannel plate, which in turn is positioned close to the screen. Further, the operating voltages for both the cathode and screen remain the same as in existing systems.

While the invention has been particularly shown and described with reference to preferred embodiments thereof, it will be understood by those skilled in the art that changes in form and details may be made therein without departing from the spirit and scope of the present invention.

What is claimed is:

1. A photocathode device, comprising:

a window layer, an active layer, a composition ramp layer, and an emissive layer, wherein said active layer is disposed over said window layer;

said composition ramp layer is disposed over said active layer; and said emission layer is disposed over said ramp layer and having an emission surface, wherein said active layer, said ramp layer, and said emission layer form a compositionally graded layer in that the bandgap is widened from said active layer to said emission layer while the dopant concentration is decreased between said active layer and said emission layer so that the conduction band profile of said device is maintained substantially flat, thereby increasing the photoresponse of said device.

2. The device of claim 1, wherein said active layer is fabricated with a GaAs material.

3. The device of claim 2, wherein said GaAs material has a doping concentration of approximately $1\times10^{17}$ $cm^{-3}$.

4. The device of claim 1, wherein said ramp layer includes both a composition transition and a doping transition where the doping density is the same as the active layer and further decreases as the material composition changes to a wider band gap.

5. The device of claim 4, wherein said composition transition of said ramp layer includes a transition from a GaAas material to an AlGaAs material.

6. The device of claim 4, wherein said doping transition of said ramp layer includes a transition from a doping concentration of approximately $1\times10^{17}$ $cm^{-3}$ to approximately $1\times10^{16}$ $cm^{-3}$.

7. The device of claim 1, wherein said emission layer is of a GaAs material.

8. The device of claim 7, wherein said GaAs material has a doping concentration of approximately $1\times10^{18}$ $cm^{-3}$.

9. A photocathode device of the type typically including a photoemissive wafer bonded to faceplate, wherein the improvement therewith comprising:

said photoemissive wafer including:

a GaAs active layer having a doping concentration of approximately $1\times10^{17}$ $cm^{-3}$; and a composition ramp layer disposed over said active layer wherein said ramp layer includes a transition from a GaAs material to an AlGaAs material, and wherein said ramp layer includes a further transition from a doping concentration of approximately $1\times10^{17}$ $cm^{-3}$ to approximately $1\times10^{16}$ $cm^{-3}$.

10. The device of claim 9, which further includes a GaAs emission layer disposed over said ramp layer having a doping concentration of approximately $1\times10^{18}$ $cm^{-3}$.

11. A photoemissive wafer of the type typically bonded to faceplate for use in a photocathode device, the photoemissive wafer comprising:

a window layer;

an active layer disposed over said window layer;

a ramp layer disposed over said active layer; and an emission layer disposed over said ramp layer and having an emission surface, wherein said active layer has a predetermined doping concentration, and wherein said ramp layer has a doping concentration that is varied in that the doping concentration of said ramp layer is substantially the same as the doping concentration of said active layer at the point where said ramp layer joins said active layer, but the doping concentration of said ramp layer decreases as said ramp layer extends away from said active layer toward said emission layer, so that the conduction band profile of said device is maintained substantially flat, thereby increasing the photoresponse of said device.

12. The photoemissive wafer of claim 11, wherein said emission layer has a doping concentration greater than the doping concentration of said active layer.

13. The photoemissive wafer of claim 12, wherein said active layer is fabricated with a GaAs material.

14. The photoemissive wafer of claim 13, wherein said GaAs material of said active layer has a doping concentration of approximately $1\times10^{17}$ $cm^{-3}$.

15. The photoemissive wafer of claim 14, wherein said doing concentration of said ramp layer varies from a doping concentration of approximately $1\times10^{17}$ $cm^{-3}$ adjacent said active layer to approximately $1\times10^{16}$ $cm^{-3}$ adjacent said emission layer.

16. The photoemissive wafer of claim 15, wherein said emission layer has a doping concentration of approximately $1\times10^{18}$ $cm^{-3}$.

17. The photoemissive wafer of claim 16, wherein said ramp layer has a width of about 0.2 to 0.3 microns, and said emission layer has a width of about 0.02 to 0.03 microns.

18. The photoemissive wafer of claim 11, wherein said ramp layer is comprised of a GaAs material and an AlGaAs material, the GaAs material being disposed adjacent the active layer in the region of said ramp layer having a higher doping concentration and the AlGaAs material being disposed adjacent the emission layer in the region of said ramp layer having a lower doping concentration.

19. The photoemissive layer of claim 11, wherein said emission layer is fabricated with a GaAs material.

* * * * *